(12) United States Patent
Huang et al.

(10) Patent No.: US 11,211,325 B2
(45) Date of Patent: Dec. 28, 2021

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Wen Hung Huang, Kaohsiung (TW); Yan Wen Chung, Kaohsiung (TW); Min Lung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/696,825

(22) Filed: Nov. 26, 2019

(65) Prior Publication Data

US 2021/0159168 A1 May 27, 2021

(51) Int. Cl.

| | |
|---|---|
| *H01L 23/522* | (2006.01) |
| *H01L 23/498* | (2006.01) |
| *H01L 23/31* | (2006.01) |
| *H01L 21/768* | (2006.01) |
| *H01L 21/56* | (2006.01) |
| *H01L 21/027* | (2006.01) |
| *H01L 23/00* | (2006.01) |
| *H01L 21/48* | (2006.01) |

(52) U.S. Cl.
CPC ...... *H01L 23/5226* (2013.01); *H01L 21/0275* (2013.01); *H01L 21/486* (2013.01); *H01L 21/565* (2013.01); *H01L 21/76807* (2013.01); *H01L 21/76877* (2013.01); *H01L 23/3121* (2013.01); *H01L 23/49816* (2013.01); *H01L 23/49833* (2013.01); *H01L 24/05* (2013.01); *H01L 24/29* (2013.01); *H01L 2224/02372* (2013.01)

(58) Field of Classification Search
CPC ........ H01L 23/49833; H01L 23/49816; H01L 24/05; H01L 23/5266
See application file for complete search history.

(56) References Cited

U.S. PATENT DOCUMENTS

| | | | |
|---|---|---|---|
| 10,096,571 B2* | 10/2018 | Yu | ........................... H01L 23/31 |
| 2016/0141246 A1* | 5/2016 | Kim | .................. H01L 23/49822 257/750 |
| 2016/0293535 A1* | 10/2016 | Fukasawa | ............. H01L 23/538 |
| 2018/0352658 A1* | 12/2018 | Yang | ................... H01L 23/5386 |

* cited by examiner

*Primary Examiner* — Phat X Cao
(74) *Attorney, Agent, or Firm* — Foley & Lardner LLP

(57) ABSTRACT

A semiconductor package may include a first substrate and a second substrate, a redistribution layer (RDL), a first conductive via and a second conductive via. The first substrate has a first surface and a second surface opposite to the first surface. The second substrate has a first surface and a second surface opposite to the first surface. The RDL is disposed on the first surface of the first substrate and the first surface of the second substrate. The first conductive via passes through the RDL and is electrically connected to the first substrate. The second conductive via passes through the RDL and is electrically connected to the second substrate.

5 Claims, 17 Drawing Sheets

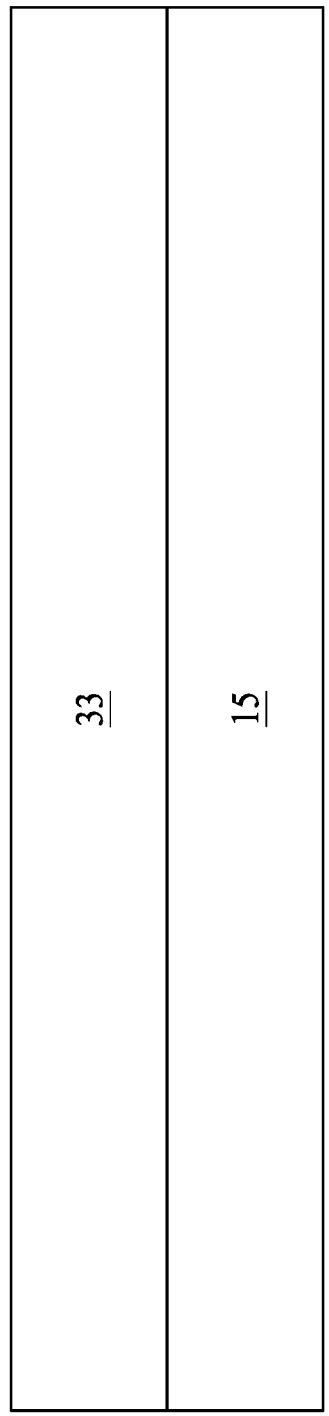

SEMICONDUCTOR DEVICE PACKAGE AND METHOD FOR MANUFACTURING THE SAME

BACKGROUND

1. Technical Field

The present disclosure relates to a semiconductor device package and a method for manufacturing the same, and to a semiconductor package including at least one or more substrates.

2. Description of the Related Art

A semiconductor device package may include multiple laterally disposed substrates, or so-called "substrate partition". The multiple substrates can be electrical interconnected to each other through conductive vias in a conductive wiring layer extending across the multiple substrates. Under the comparative practice to form a conductive via trench, the aperture of the conductive via trench may be large to an extent of greater than about 70 μm in diameter. The aperture of the conductive via trench may constrain the size reduction of the semiconductor device package.

SUMMARY

In accordance with some embodiments of the present disclosure, a semiconductor package may include a first substrate and a second substrate, a redistribution layer (RDL), a first conductive via and a second conductive via. The first substrate has a first surface and a second surface opposite to the first surface. The second substrate has a first surface and a second surface opposite to the first surface. The RDL is disposed on the first surface of the first substrate and the first surface of the second substrate. The first conductive via passes through the RDL and is electrically connected to the first substrate. The second conductive via passes through the RDL and is electrically connected to the second substrate.

In accordance with some embodiments of the present disclosure, a semiconductor device package includes a first substrate, a second substrate, a RDL, an adhesive layer, a first conductive via and a second conductive via. The first substrate has a first surface and a second surface opposite to the first surface. The second substrate has a first surface and a second surface opposite to the first surface. The RDL is disposed on the first surface of the first substrate and the first surface of the second substrate. The adhesive layer is disposed between the first substrate, the second substrate and the RDL. The first conductive via passes through the RDL, the adhesive layer, and the first surface of the first substrate.

In accordance with some embodiments of the present disclosure, a method for manufacturing a semiconductor device package includes providing a first substrate having a first surface and a second surface opposite to the first surface; providing a second substrate having a first surface and a second surface opposite to the first surface; reconstituting the first substrate and the second substrate and obtaining an encapsulant surface; attaching a redistribution layer (RDL) over the encapsulant surface; and forming a first via trench by removing a portion of the RDL and the encapsulant surface.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N, and FIG. 2O illustrate cross sections of a semiconductor device package during various manufacturing stages according to a method for manufacturing the semiconductor device package depicted in FIG. 1.

Figure 1:
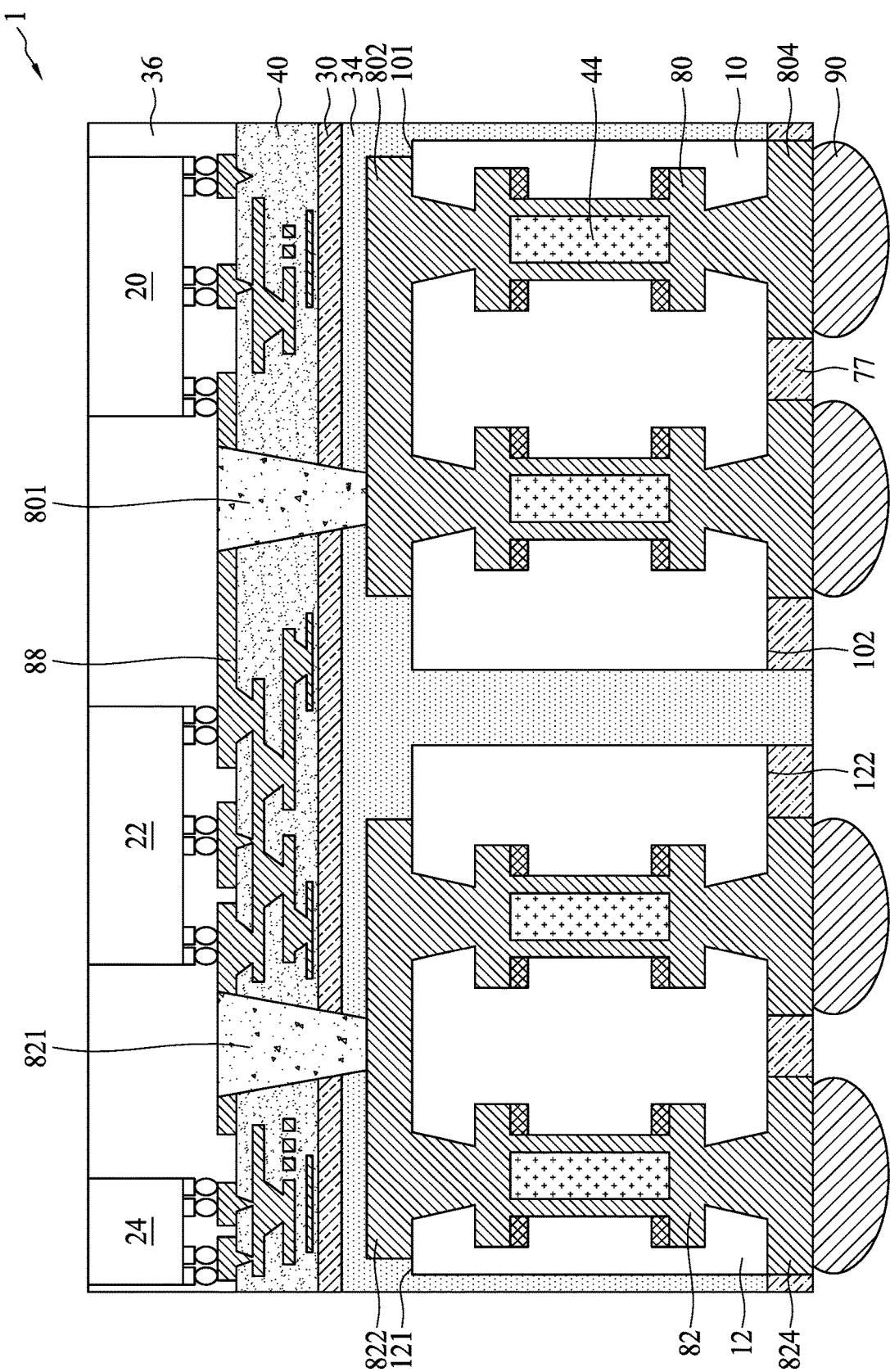
FIG. 1 illustrates a cross section of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

Various embodiments of the present disclosure are discussed in detail below. It should be appreciated, however, that the embodiments set forth many applicable concepts that can be embodied in a wide variety of specific contexts. It is to be understood that the following disclosure provides for many different embodiments or examples of implementing different features of various embodiments. Specific examples of components and arrangements are described below for purposes of discussion. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

In semiconductor device package with high I/O count, electrical connection among partition substrates is realized by forming conductive via in a conductive wiring layer across the partition substrates. As previously discussed in the background section of the present disclosure, to reduce the size of the semiconductor device package, the aperture of the conductive via trench should be reduced. Generally speaking, mechanical drilling has been exploited in the conductive via trench formation, and an average diameter cause by mechanical drilling is more than about 70 μm. Unless this dimension can be reduced by drilling techniques otherwise available, the reduction of the semiconductor device package size, particularly in the partition substrate configuration, cannot be realized.

Present disclosure provides a semiconductor device package having a partition substrate configuration, and a conductive via electrically connecting each of the partition substrates may possess a dimension in a range of from about 20 μm to a bout 60 μm. In some embodiments, conductive traces in the conductive wiring layer are utilized as hard mask pattern for the conductive via trench formation, thereby achieving a smaller dimension of the conductive via. By exploiting the structure and the manufacturing method disclosed in the present disclosure, semiconductor device package with high I/O count can enjoy the advantage of high product yield that partition substrate configuration provides.

FIG. 1 illustrates a cross section of a semiconductor device package 1 in accordance with some embodiments of the present disclosure. The semiconductor device package 1 includes a substrate 10, a substrate 12, an adhesive layer 30, a redistribution layer (RDL) 40, semiconductor dies 20, 22 and 24 and connectors 90.

The substrate 10 has a first surface 101 and a second surface 102 opposite to the first surface 101. The substrate 10 may include a semiconductor material, glass, a polymer (e.g., polypropylene (PP)), a resin (e.g., Bismaleimide-triazine (BT) resin or a glass-reinforced epoxy resin like FR-4 resin), a copper clad laminate (CCL) substrate or another suitable material to support components thereon. The substrate 12 has a first surface 121 and a second surface 122 opposite to the first surface 121. The structure of the substrate 12 is similar to the structure of the substrate 10.

A interconnect structure 80 passes through the substrate 10. A interconnect structure 82 passes through the substrate 12. The interconnect structures 80 and 82 may be, for example, copper (Cu), another metal, an alloy, or other suitable conductive materials. An insulation material 44 may be embedded in the interconnect structures 80 and 82. The insulation material 44 may include a silicon nitride (SiN$_x$) film; however, other suitable materials may be additionally or alternatively used.

The interconnect structure 80 includes a conductive pad 802 and conductive pad 804. The interconnect structure 82 includes a conductive pad 822 and conductive pad 824. The conductive pads 802, 804, 822 and 824 may be, for example, Cu, another metal, an alloy, or other suitable conductive materials. The conductive pad 802 is disposed on the first surface 101 of the substrate 10. The conductive pad 822 disposed on the first surface 121 of the substrate 12. The RDL 40 is disposed on the first surface 101 of the first substrate 10 and disposed on the first surface 121 of the second substrate 12.

A conductive via 801 passes through the RDL 40. A conductive via 821 passes through the RDL 40. The conductive via 801 is electrically connected to the substrate 10 through the conductive pad 802 of the interconnect structure 80. The conductive via 821 is electrically connected to the substrate 12 through the conductive pad 822 of the interconnect structure 82. The conductive via 801 is electrically connected to the conductive pad 802 and the conductive via 821 is electrically connected to the conductive pad 822. The conductive vias 801 and 821 may include Cu, another metal, an alloy, or other suitable conductive materials.

The lateral aperture of at least one of the conductive via 801 and conductive via 821 is in a range of from about 20 micrometers (μm) to about 60 μm. The interconnect structure 80 is electrically coupled to the interconnect structure 82 through the conductive via 801, the RDL, and the conductive via 802.

An adhesive layer 30 is disposed between the substrate 10, the substrate 12 and the RDL 40. The RDL 40 is attached to a molding compound 34 through the adhesive layer 30.

The conductive via 801 and conductive via 821 pass through the adhesive layer 30 and respectively contact the conductive pads 802 and 822. Conductive traces and pads 88 are disposed on the top surface of the RDL 40. The conductive traces and pads 88 may include Cu, another metal, an alloy, or other suitable conductive materials.

The conductive via 801 passes through the conductive traces and pads 88, the RDL 40, the adhesive layer 30, and connects to the conductive pad 802 of the substrate 10. The conductive via 821 passes through the conductive traces and pads 88, the RDL 40, the adhesive layer 30, and connects to the conductive pad 822 of the substrate 12.

The molding compound 34 encapsulates the conductive pad 802, 804, 822 and 824, the substrate 10, and the substrate 12. In some embodiments, the connectors 90 may include a solder ball or other suitable conductive materials. The connectors 90 contacts and are electrically connected to the conductive pads 804 and 824. In some embodiments, a solder mask 77 can be disposed on the surface 102 of the substrate 10 and the surface 122 of the substrate 12. A molding compound 36 is disposed on the top surface of the RDL 40. The molding compound 36 covers the top surface of the RDL 40 and encapsulates the conductive traces and pads 88 at the top surface of the RDL 40 and the semiconductor dies 20, 22 and 24 disposed over the RDL 40.

The conductive via 801 passes through the RDL and is electrically connected to the interconnect structure 80. The conductive via 821 passes through the RDL and is electrically connected to the interconnect structure 82. The adhesive layer 30 disposed between the substrates 10, 12 and the RDL 40 may facilitate the attachment of a pre-formed RDL 40 to the top surface of the molding compound 34, prior to the conductive via trench formation operation, as will be described in FIG. 2G and FIG. 2H of the present disclosure.

Figure 2A:
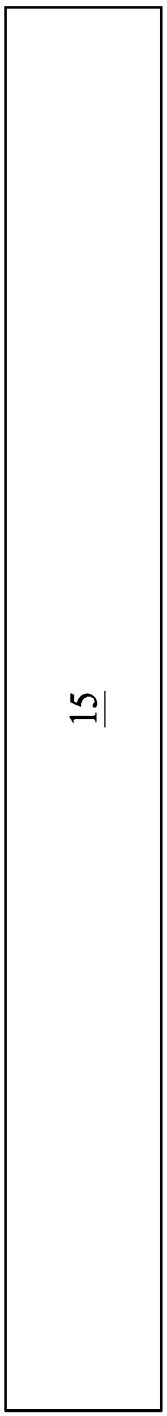
Figure 2C:
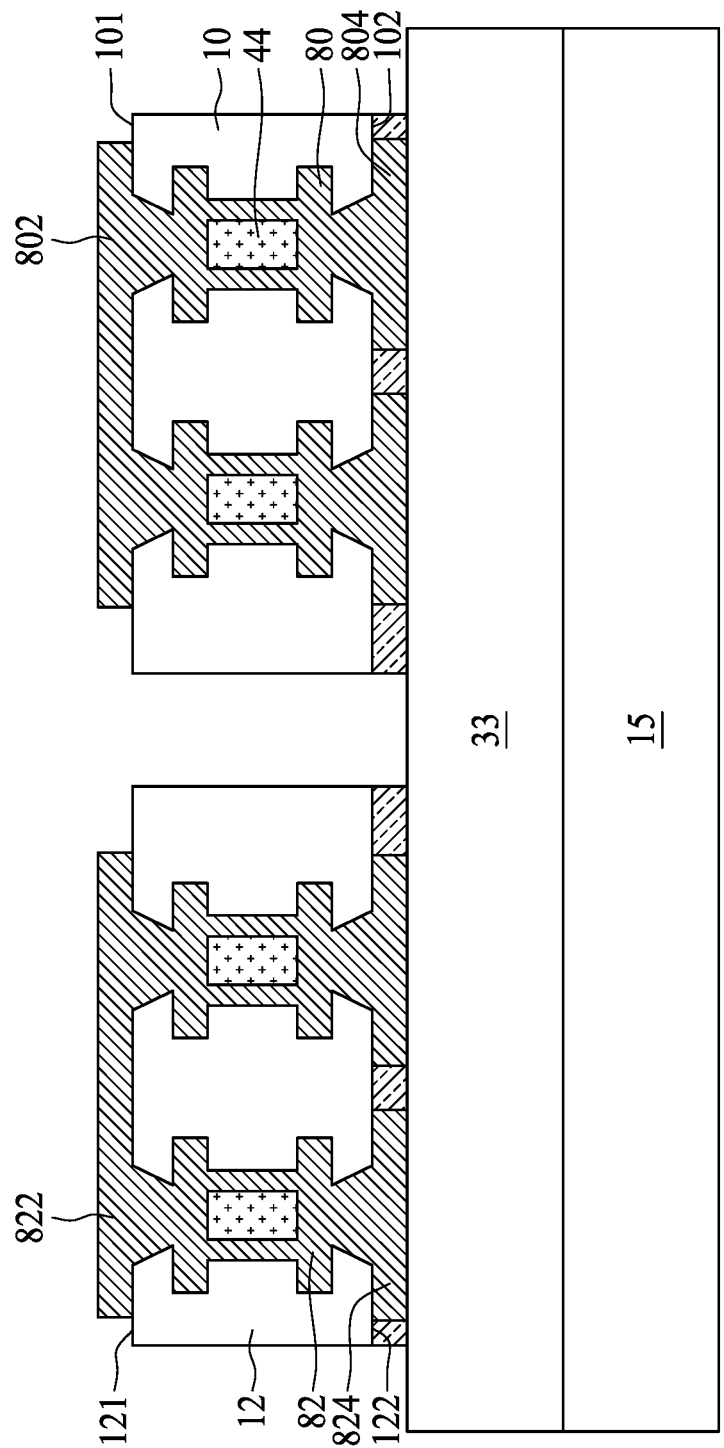
Figure 2D:
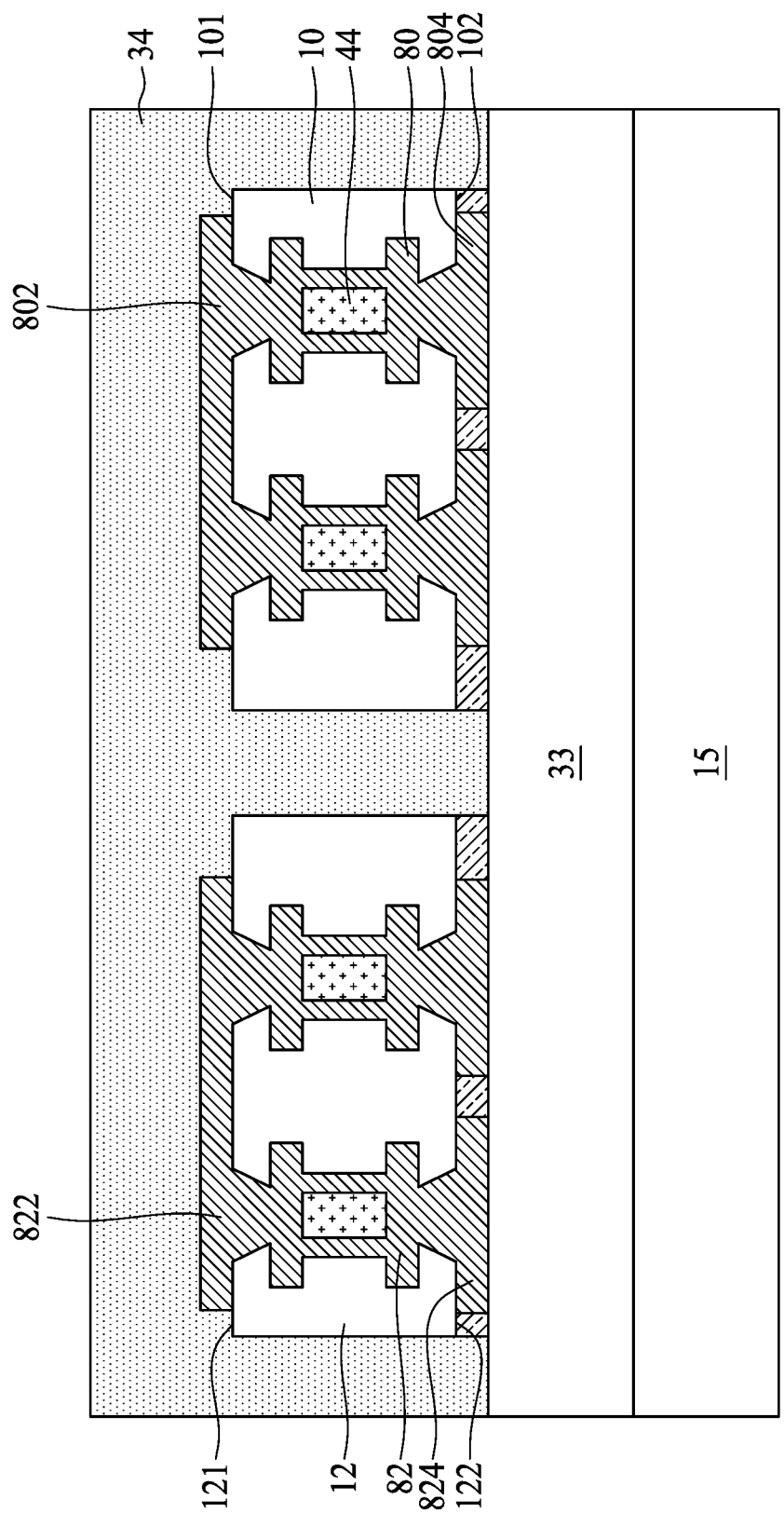
Figure 2E:
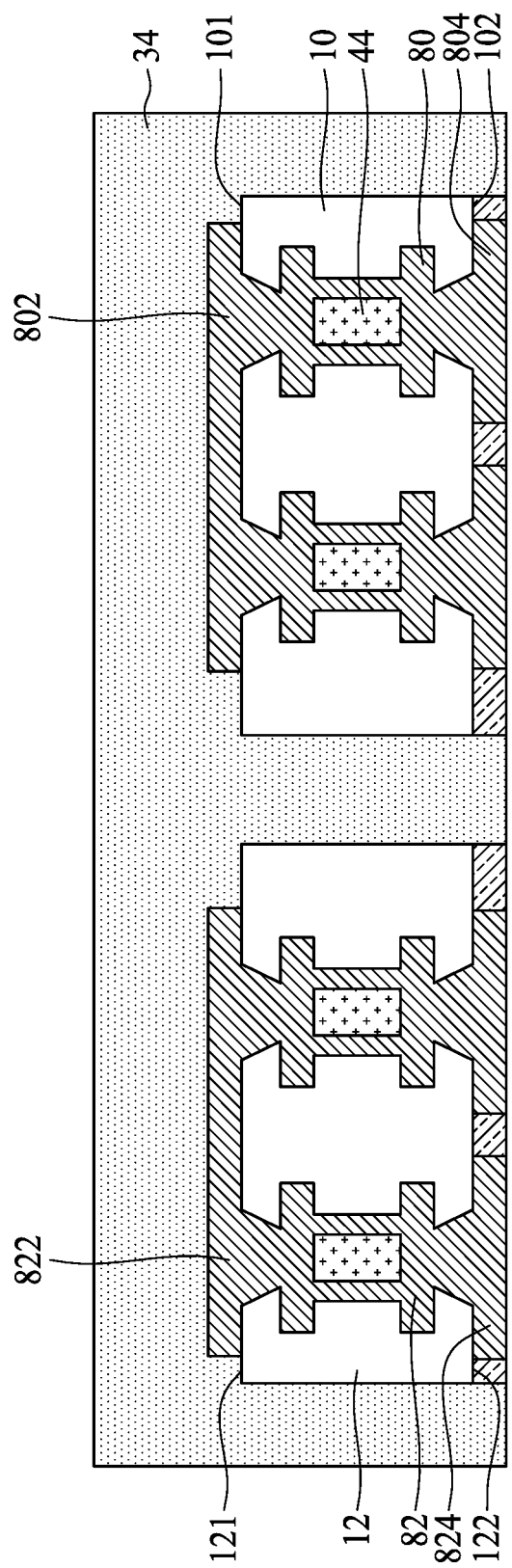
Figure 2F:
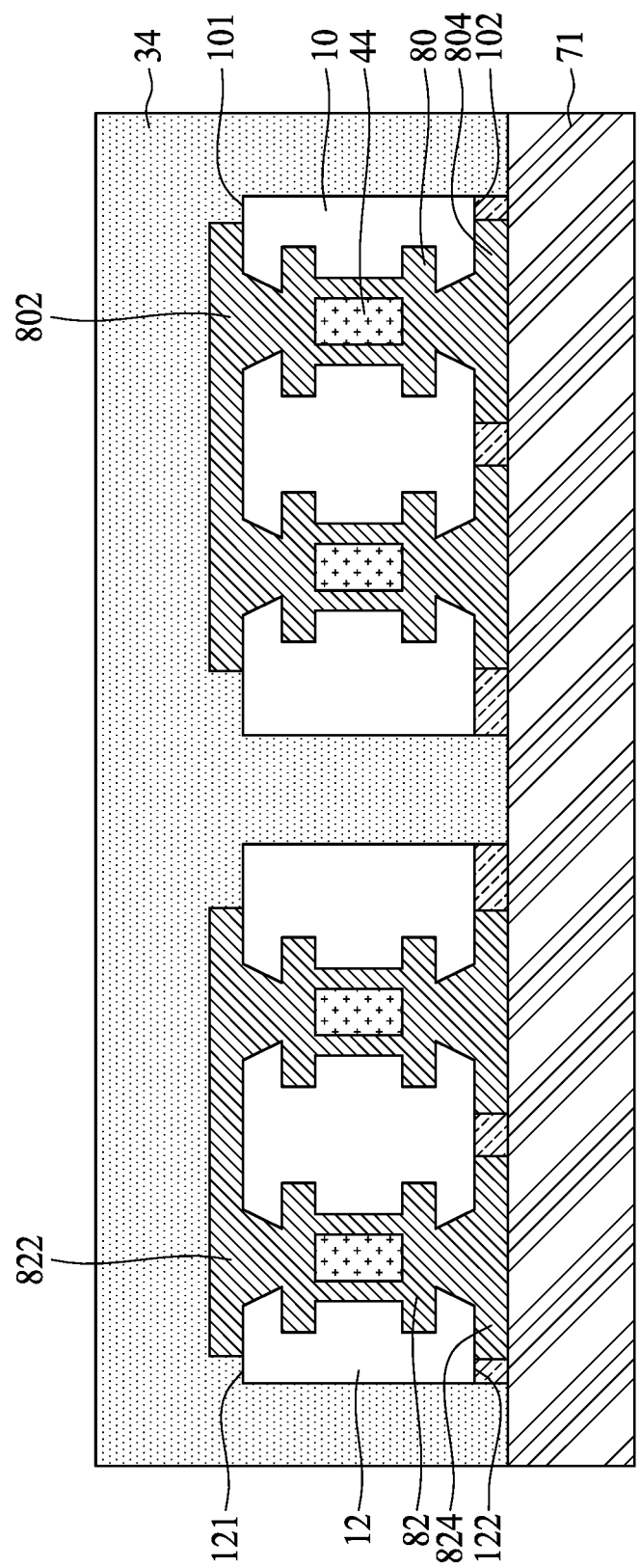
Figure 2G:
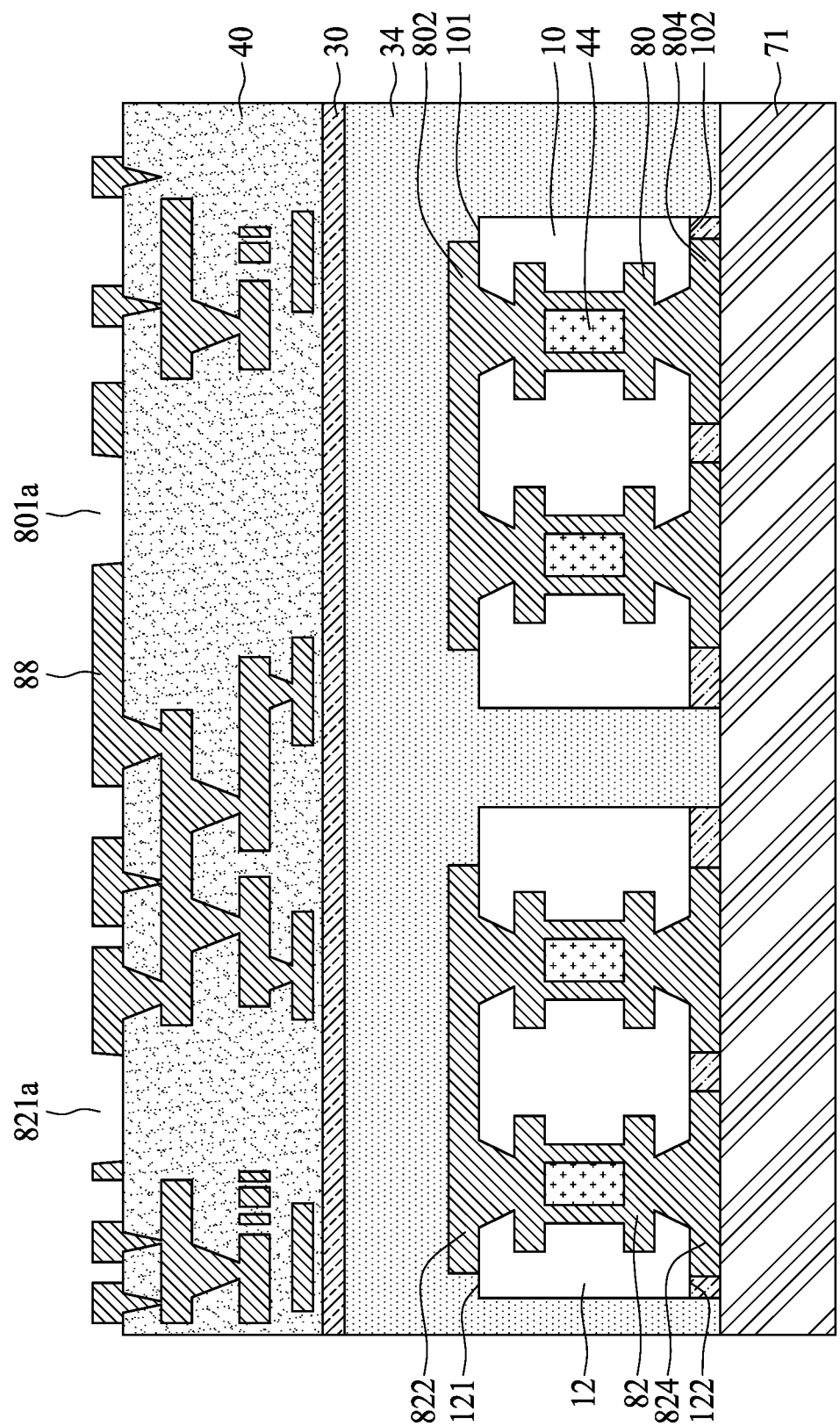
Figure 2H:
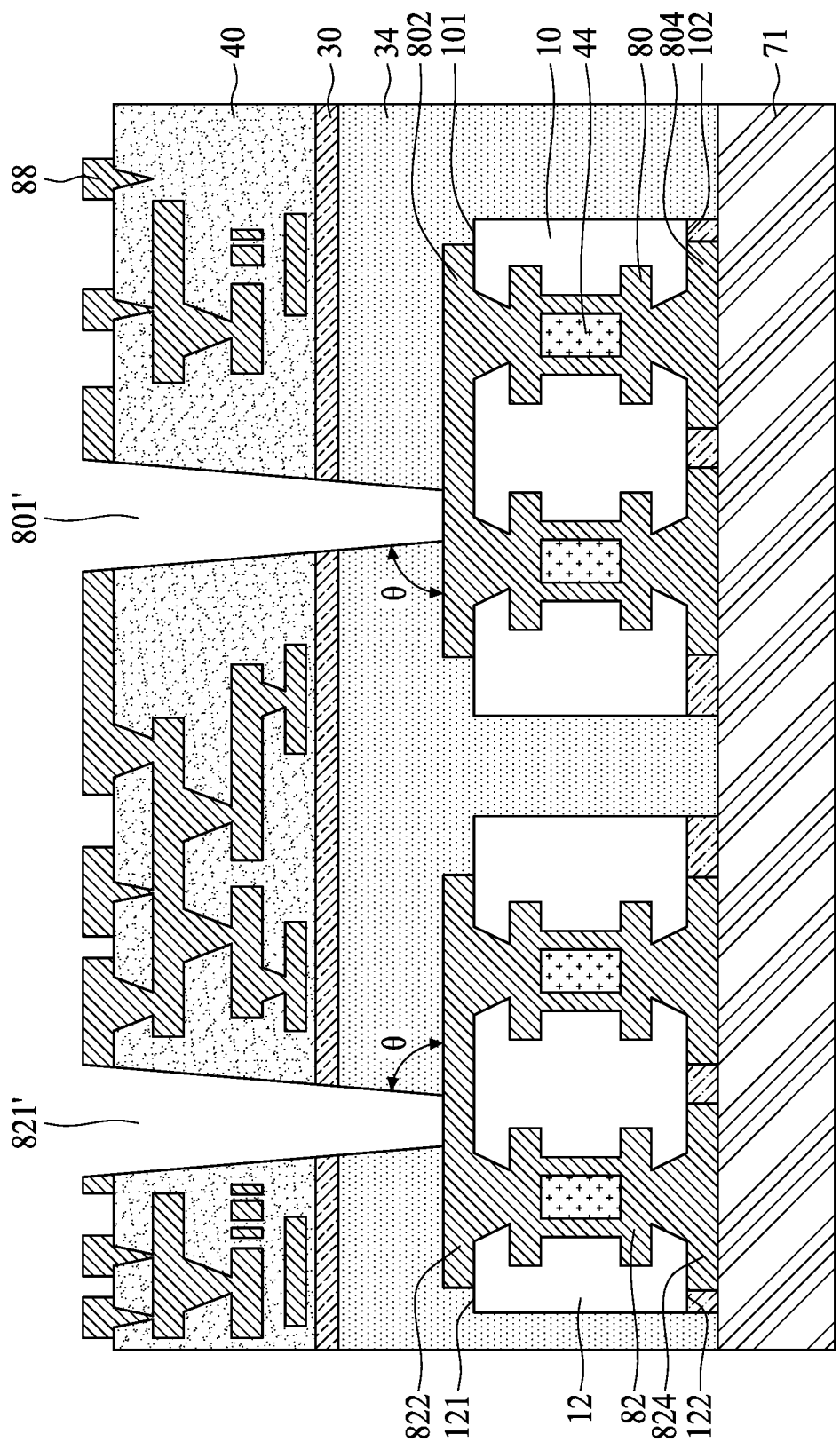
Figure 2I:
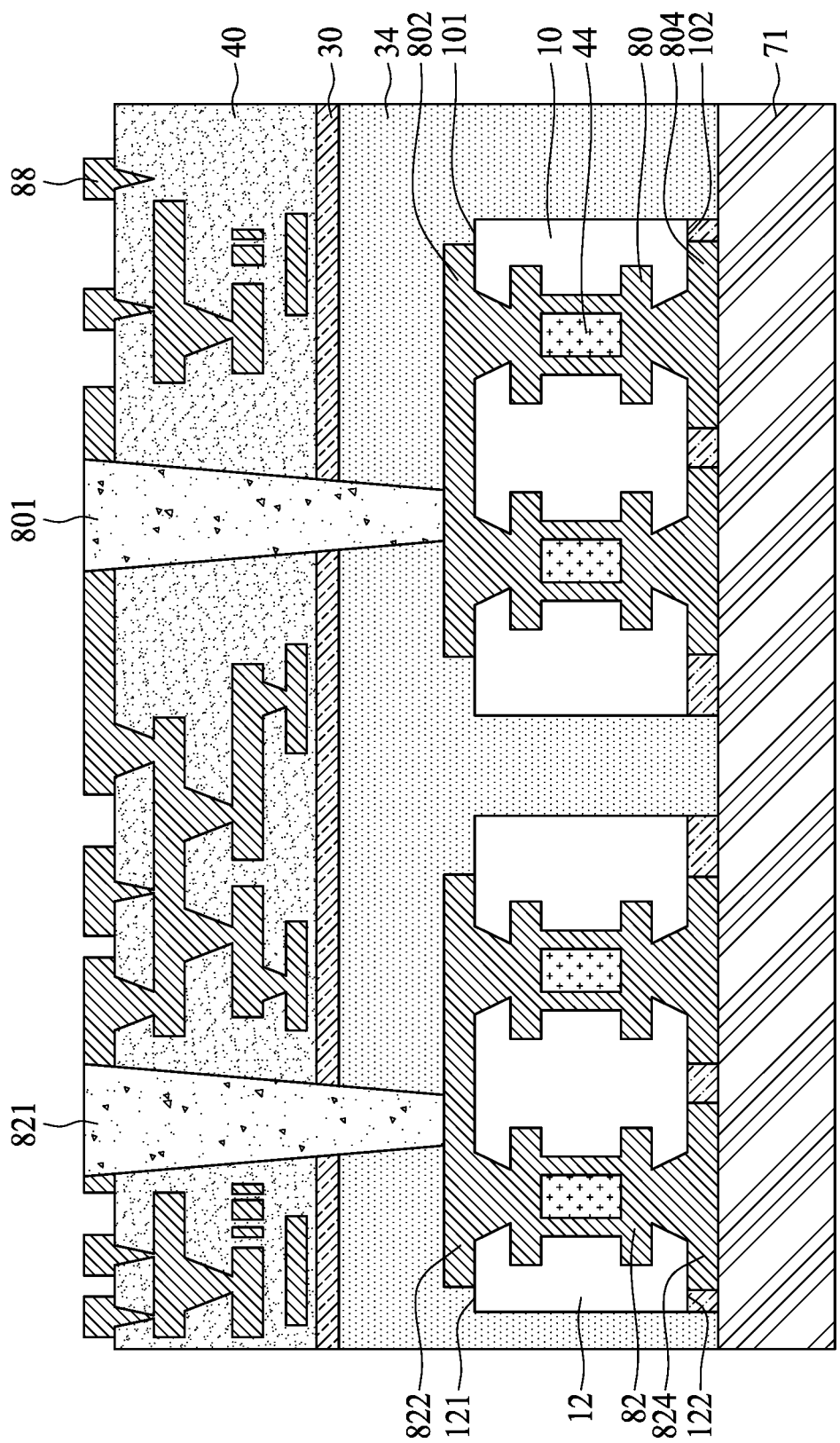
Figure 2J:
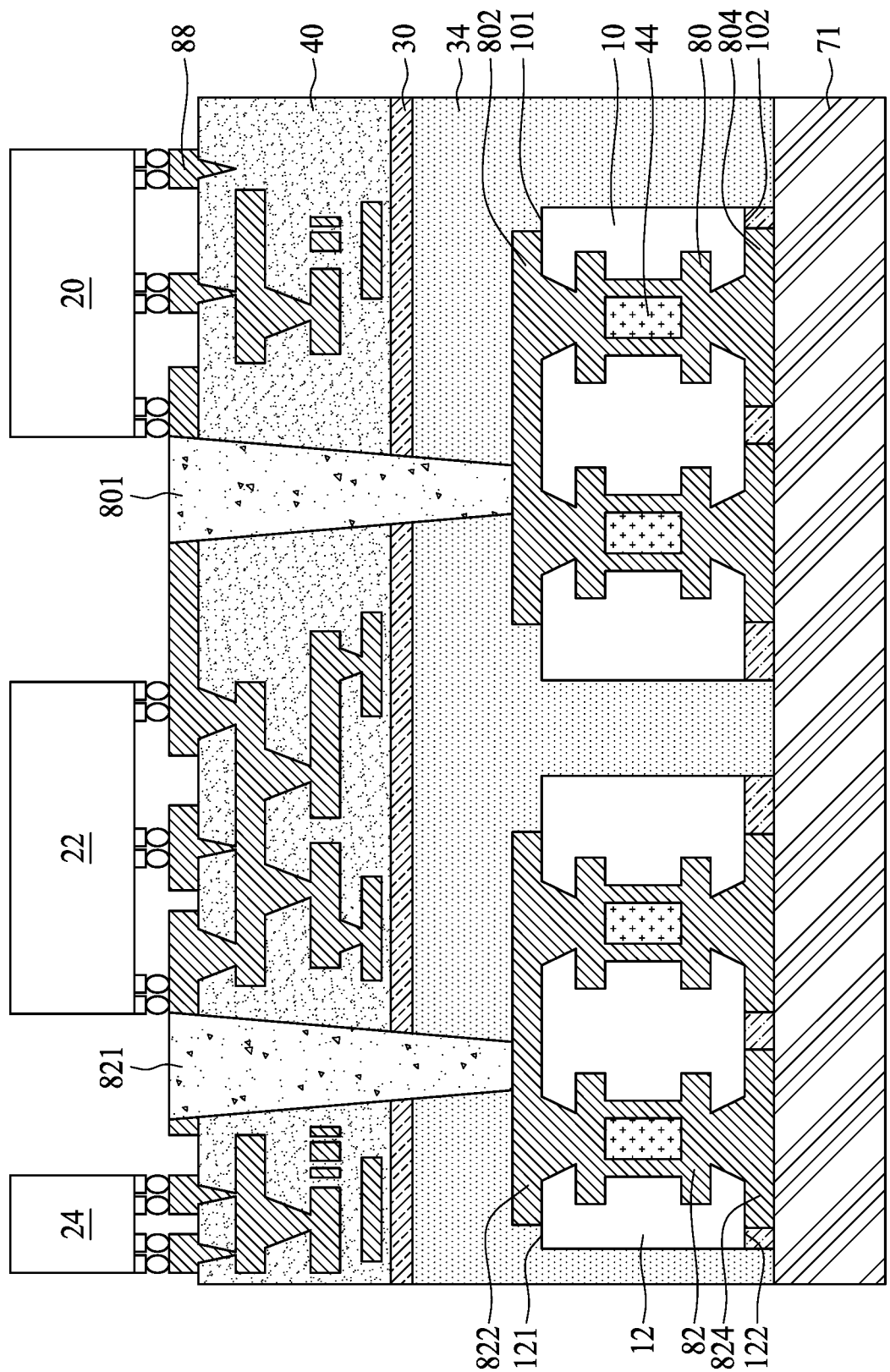
Figure 2K:
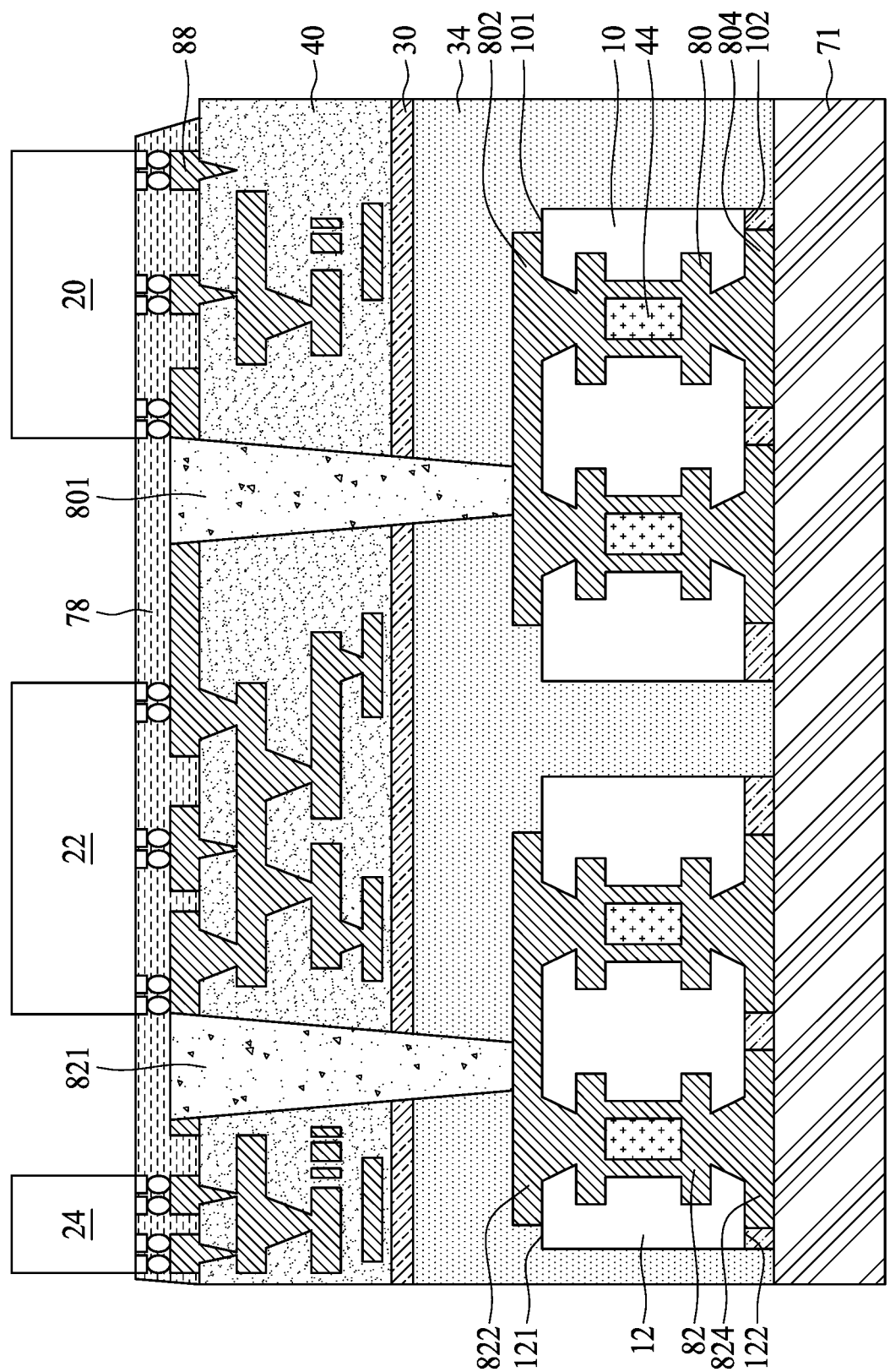
Figure 2L:
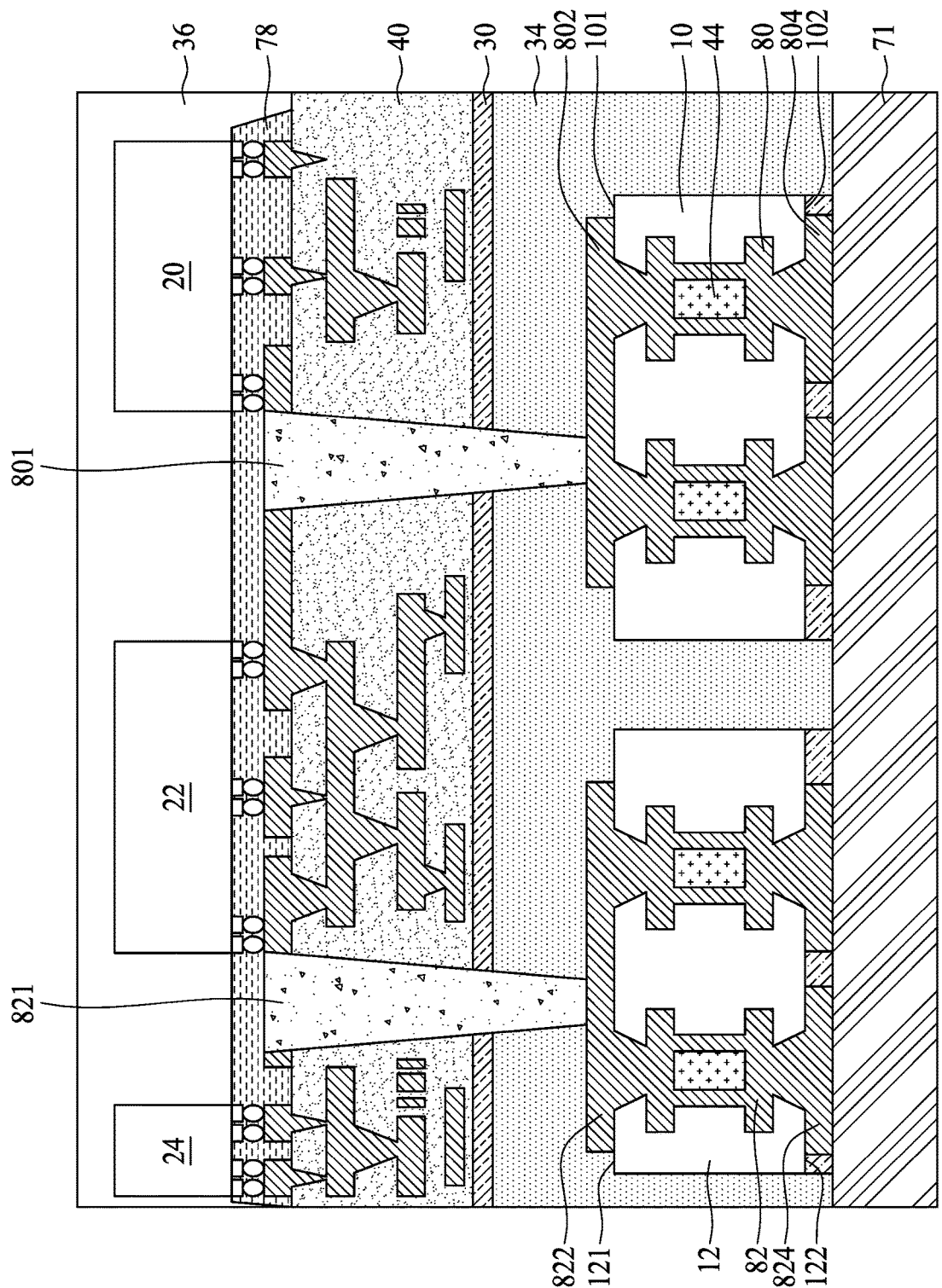
Figure 2M:
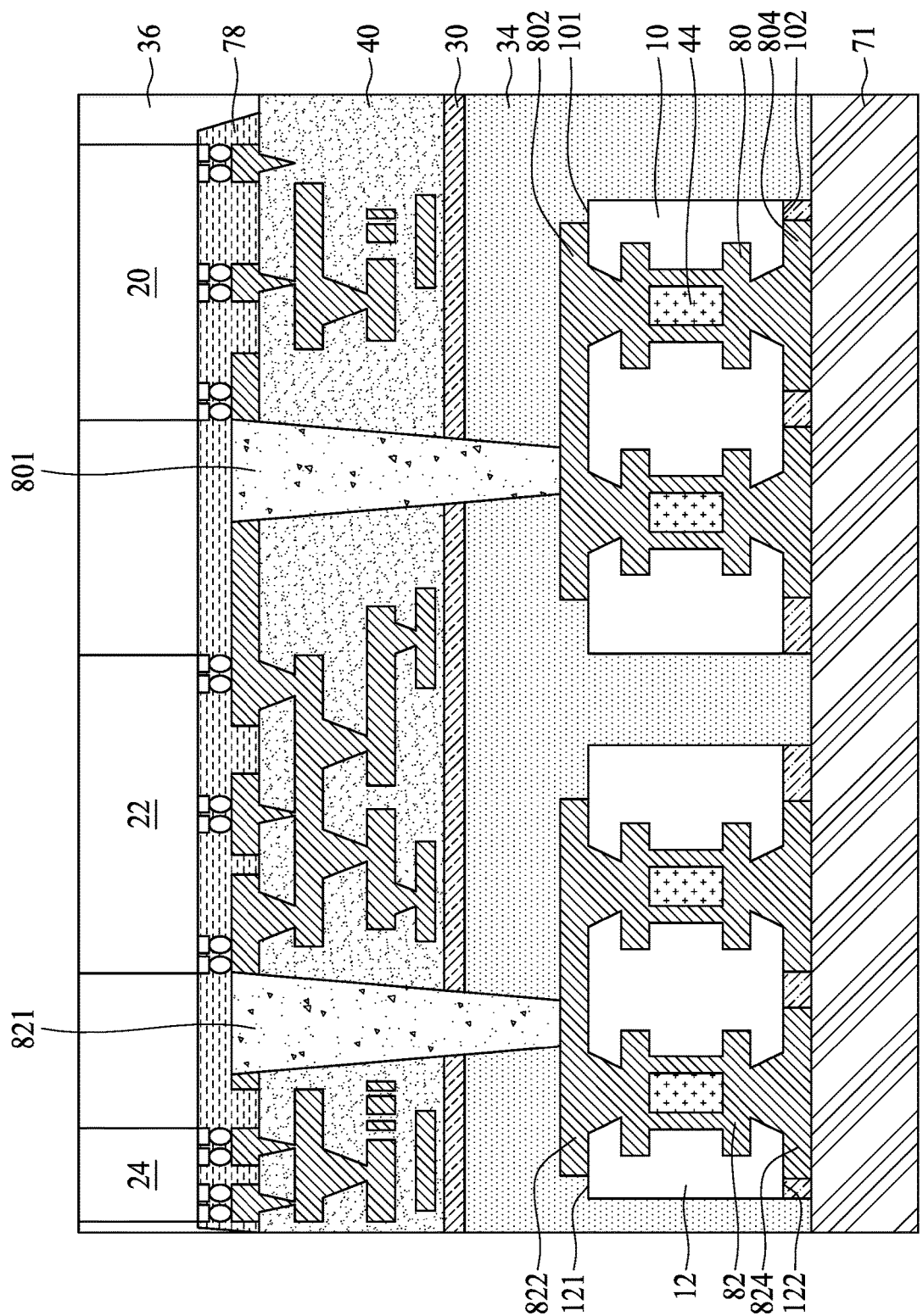
Figure 2N:
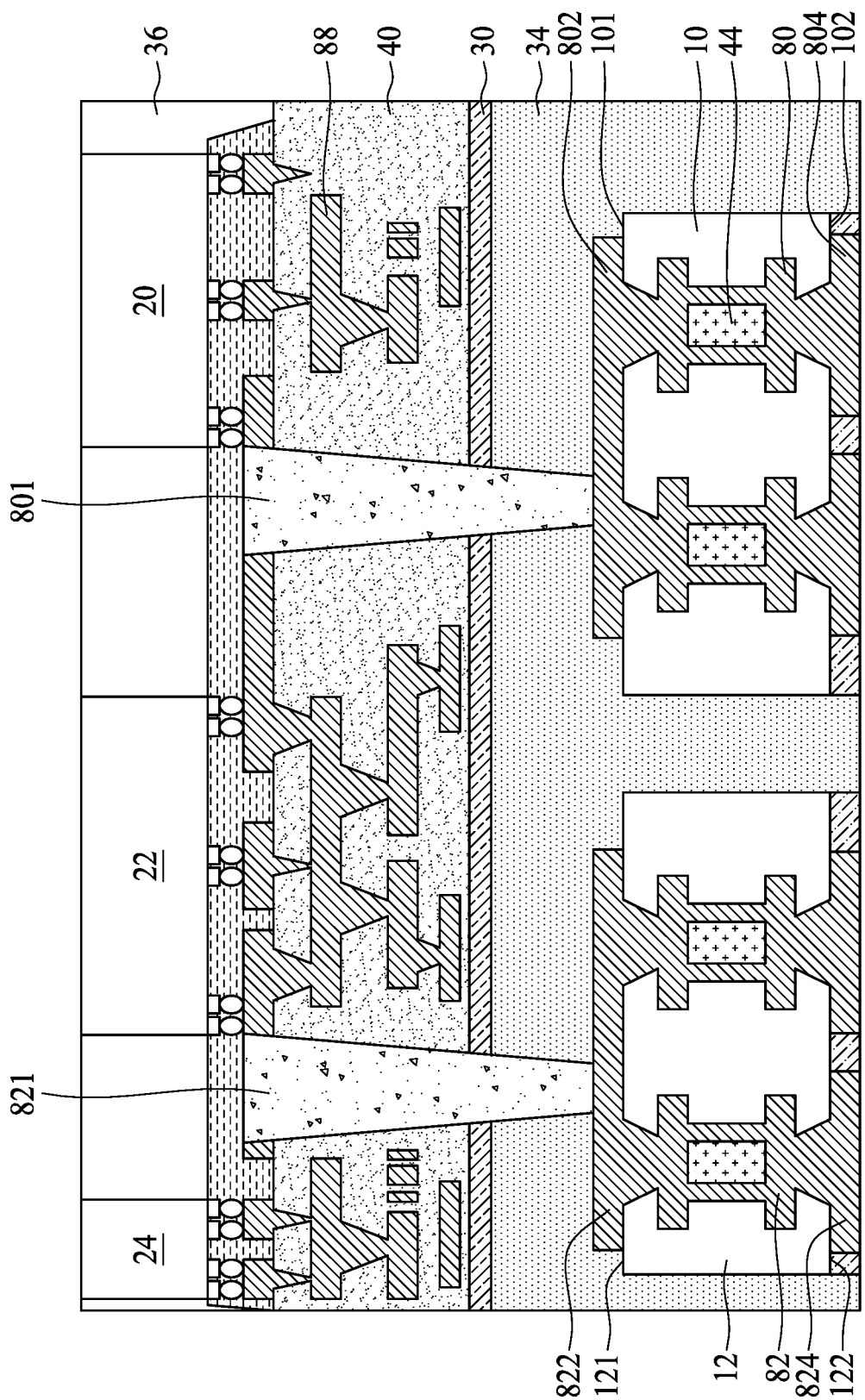
Figure 2O:
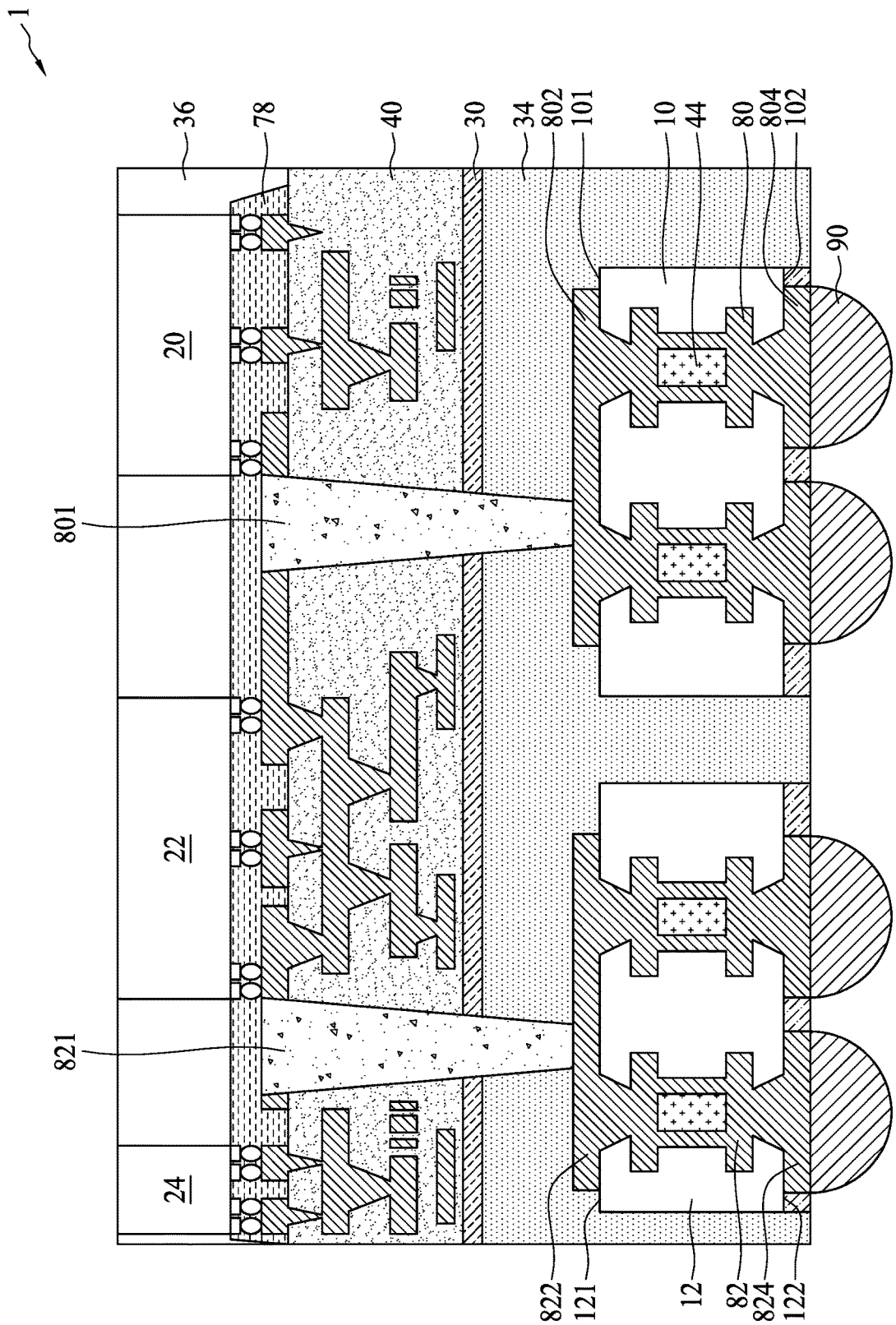

FIGS. 2A-2O illustrate cross sections of a semiconductor device package during various manufacturing stages according to a method for manufacturing the semiconductor device package 1 depicted in FIG. 1.

Referring to FIG. 2A, a carrier 15 is provided. Referring to FIG. 2B, an adhesive layer 33 is disposed on the top surface of the carrier 15.

Referring to FIG. 2C, multiple discrete substrates 10 and 12 are attached on the top surface of the adhesive layer 33. The substrate 10 and 12 may be composed of a semiconductor material, glass, a polymer (e.g., polypropylene (PP)), a resin (e.g., Bismaleimide-triazine (BT) resin or a glass-reinforced epoxy resin like FR-4 resin), a copper clad laminate (CCL) substrate or another suitable material to support components thereon. Interconnect structures 80 and 82 may be pre-formed in the substrates 10 and 12. In some embodiments, the substrates 10 and 12 are known-good substrates. In some embodiments, passive components may be embedded in the substrates 10 and 12.

Referring to FIG. 2D, a molding compound 34 is formed to encapsulate the substrates 10 and 12. The substrate 10 and the substrate 12 are reconstituted on the adhesive layer 33. The molding compound 34 covers a portion of the top surface of the adhesive layer 33. Next, an encapsulant surface of the molding compound 34 (over the substrate 10 and the substrate 12) is obtained after forming the molding compound 34.

Referring to FIG. 2E, since the molding compound 34 formed in FIG. 2D may provide sufficient mechanical support to the reconstituted substrate 10 and 12, the adhesive layer 33 and the carrier 15 are subsequently removed. The bottom of the substrates 10 and 12 is exposed after this de-carrier operation. In some embodiments, the conductive pad 804 and 824 at the bottom surface of the substrates 10, 12 are exposed after the adhesive layer 33 and the carrier 15 are removed.

Referring to FIG. 2F, the bottom of the substrates 10 and 12 is attached to a tape 71 in order to protect the conductive pad 804, 824 and other conductive trace structure at the bottom surface of the substrates 10, 12. Referring to FIG. 2G, an adhesive layer 30 is applied to the top surface of the molding compound 34. Subsequently, an RDL 40 is formed on the adhesive layer 30. In some embodiments, the RDL 40 is a pre-formed component that can be attached to the reconstituted partition substrates 10, 12 by suitable alignment operations. The RDL 40 is attached over the encapsulant surface of the molding compound 34. The pre-formed RDL 40 may further increase the product yield compared to forming a bottom-up RDL layer in some comparative embodiments. The conductive traces and pads 88 at the top surface of the RDL 40 are patterned to have spaces 801a and 821a between adjacent conductive traces and pads 88 in order to serve as a hard mask in subsequent via trench formation operation. In some embodiments, the spaces 801a and 821a between adjacent conductive traces and pads 88 allow the high energy beam (e.g., laser beam) or energized plasma (e.g., plasma dry etch) to remove the dielectric portion of the RDL 40 not under the coverage or vertical projection of the conductive traces and pads 88. For example, as shown in FIG. 2Q the spaces 801a and 821a allow a circular conductive via trench or a tetragonal conductive via trench to be formed from a top view perspective.

Referring to FIG. 2H, a via trench 801' is formed and a via trench 821' is formed by using a drilling operation, for example, a laser drilling operation or a dry plasma etch operation. The via trench 801' and 821' are formed by removing a dielectric portion of the RDL and the underlying encapsulant surface of the molding compound 34.

In some embodiments, after the laser drilling operation, a portion of the conductive pads 802 and 822 is exposed. The laser drilling operation is performed by using the conductive traces or pads 88 of the RDL as a hardmask. In some embodiments, the selectivity of the dielectric and metal traces on or in the RDL 40 is greater than 1 with respect to the laser drilling operation. For example, the laser drilling operation removes the dielectric with a rate faster than that removing the metal traces. After laser drilling, the top openings of the via trenches 801' and 821' are greater than the bottom openings of the via trenches 801' and 821'. In some embodiments, an inclined angle θ of the conductive via trench after applying laser drilling can be in a range of from about 75 degree to about 80 degree.

In some embodiments, after the plasma dry etch operation, a portion of the conductive pads 802 and 822 is exposed. The plasma dry etch operation is performed by using the conductive traces or pads 88 of the RDL as a hardmask. In some embodiments, the selectivity of the dielectric and metal traces on or in the RDL 40 is greater than 1 by performing the plasma dry etch operation. After plasma dry etch, the top openings of the via trenches 801' and 821' are greater than the bottom openings of the via trenches 801' and 821'. In some embodiments, an inclined angle θ of the conductive via trench after applying plasma dry etch can be in a range of from about 85 degree to about 90 degree.

Referring to FIG. 2I, a conductive material is filled in the via trenches 801' and 821' by an electroplating operation. Before filling the conductive material, a seed layer may be formed by an electroless plating operation in the via trench 801' and 821'.

The conductive material may include Cu, another metal, an alloy, or other suitable conductive material. After filling, the conductive via 801 and conductive via 821 is formed. The top surface of the conductive via 801 and conductive via 821 is exposed.

Referring to FIG. 2J, semiconductor dies 20, 22 and 24 are disposed on the conductive traces and pads 88 of the RDL 40. Note the conductive traces and pads 88 are patterned to serve as a hard mask in the conductive via trench formation operation and to serve as conductive traces or pads for the disposal of the semiconductor dies 20, 22 and 24. In some embodiments, the semiconductor dies 20, 22 and 24 are flip chip bonded to the conductive traces and pads 88. The semiconductor dies 20, 22 and 24 are electrically to the conductive traces and pads 88.

Referring to FIG. 2K, an underfill 78 may be formed on to fill the spaces between the conductive traces and pads 88 and the bottom of the semiconductor dies 20, 22 and 24. The underfill 78 covers a portion of the top surface of the RDL 40. Although not illustrated in FIG. 2K, the underfill 78 may be localized under each of the semiconductor dies 20, 22 and 24.

Referring to FIG. 2L, a molding compound 36 is formed to encapsulate the semiconductor dies 20, 22 and 24 and the underfill 78. In some embodiments, the molding compound 36 may be in contact with a portion of the top surface of the RDL 40 which is not covered by the underfill 78.

Referring to FIG. 2M, a grinding operation is performed on the top surface of the molding compound 36. In some embodiments, the underfill 78 may be omitted. In addition to encapsulating the top surfaces and sidewalls of the semiconductor dies 20, 22 and 24, the molding compound 36 may be in contact with a portion of the top surface of the RDL 40 and conductive via 801, serving as a molded underfill (MUF). The molding compound 36 is grinded from the top surface of the molding compound 36. After the grinding operation, the semiconductor dies 20, 22 and 24 are exposed.

Referring to FIG. 2N, the tape 71 is removed. After removing the tape 71, the bottom of the substrates 10 and 12 is exposed. The conductive pad 804 and 824 are exposed after the tape 71 is removed.

Referring to FIG. 2O, connectors 90 is formed on the exposed surface of the conductive pad 804 and 824. In some embodiments, the connectors 90 may include a solder ball or other suitable conductive materials. After the connectors 90 are attached, the semiconductor device package 1 is obtained.

Figure 3:
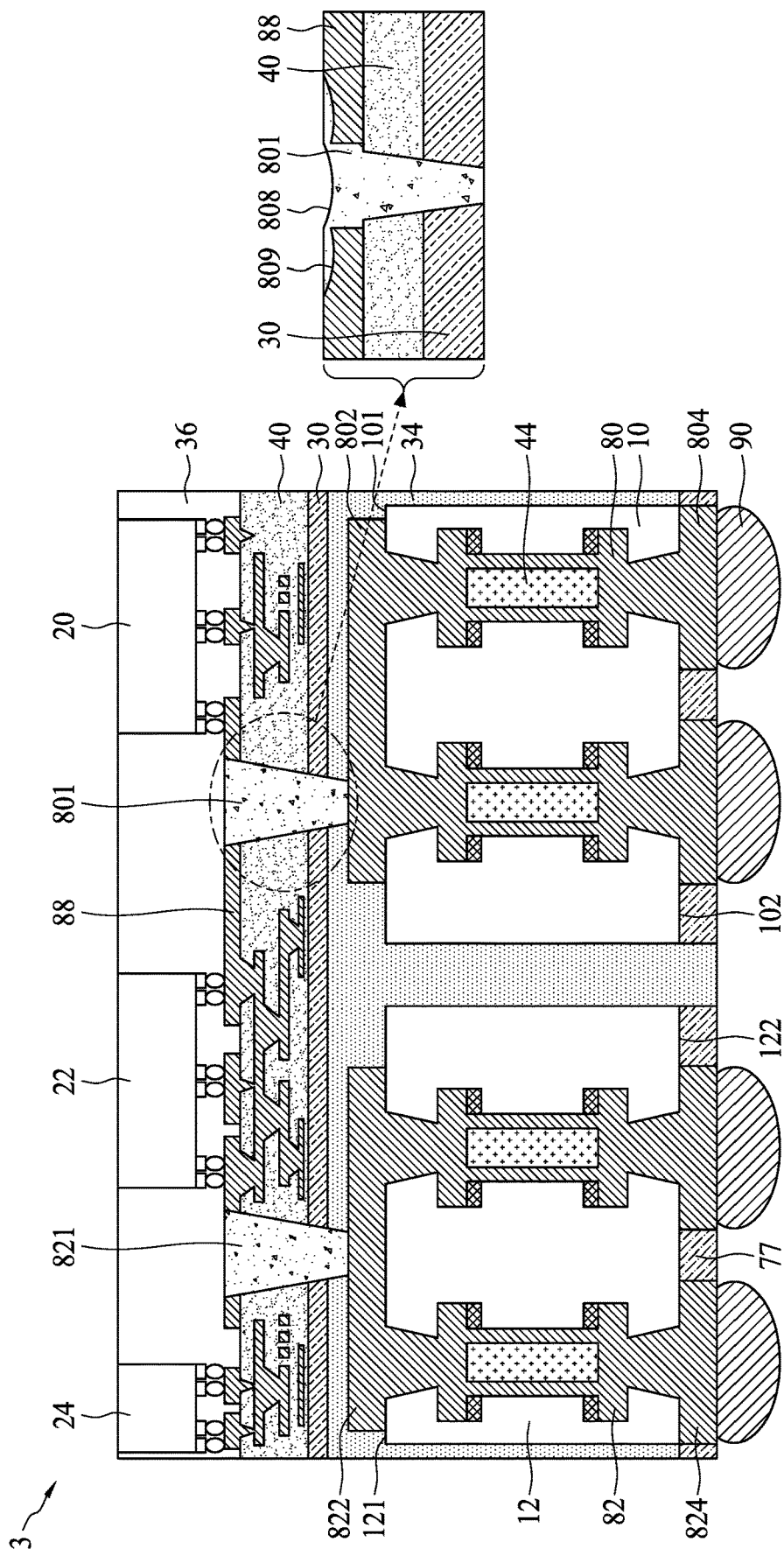
FIG. 3 illustrates a cross section and a localized enlarged cross section of semiconductor device package in accordance with some embodiments of the present disclosure.

FIG. 3 illustrates a semiconductor device package 3 in accordance with some embodiments of the present disclosure. The semiconductor device package 3 includes a substrate 10, a substrate 12, an adhesive layer 30, a RDL 40, semiconductor dies 20, 22 and 24 and connectors 90. The semiconductor device package 3 is similar to the semiconductor device package 1. The structure of the conductive via 801 is enlarged. The top surface 808 of the conductive via 801 and conductive via 821 has a dimple recess 808. The depth of the dimple recess 808 is approximately 3 μm to 5 μm.

The conductive traces and pads 88 is disposed on the top surface of the RDL 40. The conductive traces and pads 88 has a dish structure 809. A portion of the dimple recess 808 is extended on the dish structure 809 of the conductive traces and pads 88. The depth of the dish structure 809 is approximately 3 μm to 5 μm. The semiconductor dies 20, 22 and 24 are electrically to the conductive traces and pads 88 through conductive pads and/or conductive contacts.

The dish structure 809 of the conductive traces and pads 88 may be formed during the laser drilling operation as previously described. An area of the laser beam may cover a greater area than the spaces between adjacent conductive traces and pads 88 itself and hence a portion of the conductive traces and pads 88 proximal to the spaces can be removed in a limited fashion with respect to the dielectric portion of the RDL 40, for example, at a selectivity of 100 to 5. The dimple recess 808 is then formed due to the topography of the conductive via trench and the conformal nature of electroplating operation. In some embodiments, a top surface of the dish structure 809 may include a seed layer to facilitate electroplating operation, as previously described in FIG. 2I.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a first substrate having a first surface and a second surface opposite to the first surface;
    a second substrate having a first surface and a second surface opposite to the first surface;
    a redistribution layer (RDL) disposed on the first surface of the first substrate and the first surface of the second substrate;
    a first conductive via passing through the redistribution layer (RDL) and electrically connected to the first substrate;
    a second conductive via passing through the redistribution layer (RDL) and electrically connected to the second substrate, wherein a top surface of at least one of the first conductive via and second conductive via has a dimple recess;
    an adhesive layer disposed over the first substrate and the second substrate, and stacked with the redistribution layer (RDL);
    a molding compound encapsulating the first substrate and the second substrate, wherein the adhesive layer is disposed on the molding compound, wherein the first conductive via passes through the adhesive layer and a portion of the molding compound and contacts a first conductive pad disposed on the first surface of the first substrate, and wherein the second conductive via passes through the adhesive layer and a portion of the molding compound and contacts a second conductive pad disposed on the first surface of the second substrate; and
    a conductive pad on the top surface of the redistribution layer (RDL), wherein the conductive pad has two dish structures and a portion of the dimple recess is extended between the two dish structures of the conductive pad.

2. The semiconductor device package according to claim 1, wherein:
    the first conductive via is electrically connected to the first conductive pad and the second conductive via is electrically connected to the second conductive pad.

3. The semiconductor device package according to claim 1, wherein the aperture of at least one of the first conductive via and second conductive via is in a range of from about 20 micrometers (µm) to about 60 µm.

4. The semiconductor device package according to claim 1, wherein the depth of the dimple recess is approximately 3 µm to 5 µm.

5. The semiconductor device package according to claim 1, wherein the depth of the dish structure is approximately 3 µm to 5 µm.

* * * * *